(12) United States Patent
Wang et al.

(10) Patent No.: US 11,296,127 B2
(45) Date of Patent: Apr. 5, 2022

(54) DISPLAY SUBSTRATE, METHOD FOR MANUFACTURING THE SAME, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Jing Wang, Beijing (CN); Dong Li, Beijing (CN); Xiaodong Xie, Beijing (CN); Min He, Beijing (CN); Weiwei Chu, Beijing (CN); Wenjie Xu, Beijing (CN); Yuan Li, Beijing (CN); Yaying Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 106 days.

(21) Appl. No.: 16/676,820

(22) Filed: Nov. 7, 2019

(65) Prior Publication Data
US 2020/0273890 A1 Aug. 27, 2020

(30) Foreign Application Priority Data
Feb. 22, 2019 (CN) .......................... 201910133138.1

(51) Int. Cl.
*H01L 23/48* (2006.01)
*H01L 27/12* (2006.01)
(52) U.S. Cl.
CPC ...... *H01L 27/1244* (2013.01); *H01L 27/1248* (2013.01); *H01L 27/1259* (2013.01)

(58) Field of Classification Search
CPC ............ H01L 27/1244; H01L 27/1248; H01L 27/1259
See application file for complete search history.

(56) References Cited

U.S. PATENT DOCUMENTS

2019/0019993 A1* 1/2019 Narutaki ............... H01L 27/124

FOREIGN PATENT DOCUMENTS

| CN | 101290905 A | 10/2008 |
|---|---|---|
| CN | 107329614 A | 11/2017 |
| CN | 107577366 A | 1/2018 |
| CN | 108829293 A | 11/2018 |
| CN | 109004068 A | 12/2018 |
| JP | 2012-234695 A | 11/2012 |
| JP | 2013-80829 A | 5/2013 |

OTHER PUBLICATIONS

First Office Action dated Aug. 31, 2020 corresponding to Chinese application No. 201910133138.1.

* cited by examiner

*Primary Examiner* — Victor A Mandala
*Assistant Examiner* — Colleen E Snow
(74) *Attorney, Agent, or Firm* — Nath, Goldberg & Meyer; Joshua B. Goldberg

(57) ABSTRACT

The present disclosure provides a display substrate, a method for manufacturing the same and a display device. The display substrate includes a base substrate, first wires on a side of the base substrate, a first barrier layer on the side of the base substrate; and a second wire on a side of the first barrier layer distal to the base substrate, where the first wires and the second wire being adjacent to and spaced apart from each other.

15 Claims, 3 Drawing Sheets

DISPLAY SUBSTRATE, METHOD FOR MANUFACTURING THE SAME, AND DISPLAY DEVICE

CROSS-REFERENCE TO RELATED APPLICATIONS

The present disclosure claims the priority of Chinese patent application No. 201910133138.1, filed on Feb. 22, 2019, the disclosure of which is incorporated herein by reference.

TECHNICAL FIELD

The present disclosure relates to the field of display technology, and particular to a display substrate, a method for manufacturing the display substrate and a display device.

BACKGROUND

In recent years, the market of displays with medium or small sizes has changed greatly, shipment of the Active-matrix organic light-emitting diode (AMOLED) is increased rapidly and thus the development thereof is vigorous, especially, the flexible display technology provides more innovative space for manufacturers.

SUMMARY

An embodiment of the present disclosure provides a display substrate, including: a base substrate; first wires on a side of the base substrate; a first barrier layer on the side of the base substrate; and a second wire, where the second wire is on a side of the first barrier layer distal to the base substrate, and the second wire is located between two adjacent first wires, and the first wires and the second wire are spaced apart from each other.

In some implementations, the first wires and the second wire have a same structure and each includes a migratable metal layer including a migratable metal, and wherein a distance from a surface of the first barrier layer distal to the base substrate to the base substrate is greater than a distance from a surface of the migratable metal layer of the first wire proximal to the base substrate to the base substrate.

In some implementations, a distance from the surface of the first barrier layer distal to the base substrate to the base substrate is greater or equal to a distance from a surface of the migratable metal layer of the first wires distal to the base substrate to the base substrate.

In some implementations, the display substrate further includes a second barrier layer, which is located on a side of the second wire distal to the base substrate.

In some implementations, an orthographic projection of the second wire on the base substrate coincides with an orthographic projection of the first barrier layer on the base substrate; and the orthographic projection of the second wire on the base substrate coincides with an orthographic projection of the second barrier layer on the base substrate.

In some implementations, the first barrier layer is made of silicon dioxide or silicon nitride, and the second barrier layer is made of indium tin oxide.

In some implementations, the display substrate further includes: a third wire on the side of the base substrate; a fourth wire on the side of the base substrate; and a third barrier layer on the side of the base substrate, the third barrier layer being located between the third wire and the fourth wire and spaced apart from the third wire and the fourth wire.

In some implementations, the third wire and the fourth wire each includes a migratable metal layer including a migratable metal, and wherein a distance from a surface of the third barrier layer distal to the base substrate to the base substrate is greater than or equal to a distance from a surface of the migratable metal layer of one of the first wire and the second wire distal to the base substrate to the base substrate.

In some implementations, the display substrate further includes a fourth barrier layer located on a side of the third barrier layer distal to the base substrate.

In some implementations, the third barrier layer is made of silicon dioxide or silicon nitride, and the fourth barrier layer is made of indium tin oxide.

In some implementations, the third wire is a first bonding terminal, the fourth wire is a second bonding terminal, the first bonding terminal is coupled with the first wire, and the second bonding terminal is coupled with the second wire.

In some implementations, the first wire is any one of a touch driving line, a touch sensing line, a gate line and a data line, and the second wire is a ground line.

An embodiment of the present disclosure further provides a display device, including the above display substrate, and an opposite substrate opposite to the display substrate.

An embodiment of the present disclosure further provides a method for manufacturing a display substrate, including: providing a base substrate; forming a first barrier layer on a side of the base substrate; forming first wires on the side of the base substrate, and forming a second wire on a side of the first barrier layer distal to the base substrate, where the second wire is arranged between two adjacent first wires, and the first wires and the second wire are spaced apart from each other.

In some implementations, the first wires and the second wire are formed to have a same structure and each includes a migratable metal layer, and wherein a distance from a surface of the first barrier layer distal to the base substrate to the base substrate is greater than or equal to a distance from a surface of the migratable metal layer of the first wire distal to the base substrate to the base substrate.

In some implementations, the method further includes: forming a second barrier layer on a side of the second wire distal to the base substrate.

In some implementations, the method further includes: forming a third wire and a fourth wire, which are adjacent to and spaced apart from each other, on the side of the base substrate; and forming a third barrier layer on the side of the base substrate and between the third wire and the fourth wire.

In some implementations, each of the third wire and the fourth wire includes a migratable metal layer, and wherein a distance from a surface of the third barrier layer distal to the base substrate to the base substrate is greater than or equal to a distance from a surface of the migratable metal layer of one of the third wire and the fourth wire distal to the base substrate to the base substrate.

In some implementations, the method further includes: forming a fourth barrier layer on a side of the third barrier layer distal to the base substrate.

In some implementations, the third wire is a first bonding terminal and the fourth wire is a second bonding terminal.

DETAILED DESCRIPTION

In order to enable those skilled in the art to better understand the technical solutions of the present disclosure, a display substrate, a method for manufacturing the same, and a display device provided by the present disclosure are described in further detail below with reference to the accompanying drawings and embodiments.

In the field of display technology, some metal materials such as silver (Ag) are excellent in ductility and conductivity, and thus are often used as components of a wire in flexible display devices. Since silver cannot form a stable and passivated oxide film, a phenomenon in which silver material migrates, commonly called silver migration, may occur between two adjacent silver-containing wires under the conditions where water vapor and potential difference exist therebetween. The silver migration principle is that:

silver reacts with water vapor to produce, by electrolysis, silver ions, i.e., $Ag \rightarrow Ag^+$, and water vapor generates hydrogen ions and hydroxide ions, i.e., $H_2O \rightarrow H^+ + OH^-$, under electrolysis, and $Ag^+$ ion begins to move from a side with high potential to a side with low potential, and it will be combined with $OH^-$ to form AgOH, which is then decomposed to form $Ag_2O$ at the side with low potential. $Ag_2O$ is in a dispersed gel state, and $Ag_2O$ is cumulatively distributed and overlapped between two adjacent silver-containing wires, so that short circuit occurs between the two adjacent silver-containing wires.

Currently, in the industry, the incidence of silver migration has been reduced by increasing spacing between silver-containing wires. However, the display device is usually in the extremely narrow bezel design, so it is not a long-term policy to solve the problem of silver migration by increasing the distance between the wires.

Figure 1:
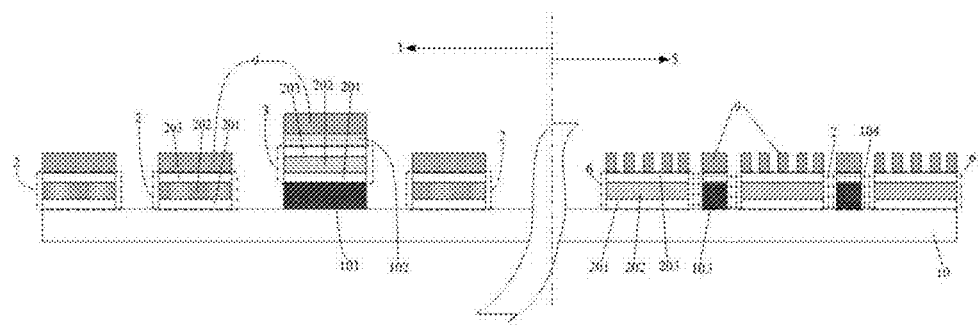
FIG. 1 is a schematic cross-sectional view of a portion of a structure of a display substrate according to an embodiment of the present disclosure.

An embodiment of the present disclosure provides a display substrate, as shown in FIG. 1, which may include a wiring region 1 in which first wires 2 and a second wire 3 are disposed adjacently above a same plane, i.e., on an upper surface of a base substrate 10, for example, the second wire 3 is disposed between two adjacent first wires 2 and the first wires 2 and the second wire 3 are spaced apart from each other. One arrangement of the first wires 2 and the second wire 3 is shown on the left side of FIG. 1, but this is not limiting. In other implementations, the first wires 2 and the second wires 3 may also be adjacent and alternately arranged or arranged in other ways. The first wire 2 and the second wire 3 have a potential difference therebetween in an operation state, and the first wire 2 and the second wire 3 contain metal materials which can migrate under the action of the potential difference and water vapor. The display substrate further comprises a first barrier layer 101, the first barrier layer 101 is arranged between the second wire 3 and the base substrate 10, the first barrier layer 101 enables the first wire 2 and the second wire 3 to be located on different planes perpendicular to a thickness direction of the display substrate and can block invasion of water vapor, and therefore metal materials in the first wire 2 and the second wire 3 can be prevented from migrating.

The metal material which can migrate under the action of the potential difference and the water vapor may be silver (Ag), copper (Cu), or the like. Since the metal material which can migrate easily migrates under the action of the potential difference and the water vapor to form the dispersed gel structure, the dispersed gel structure accumulated between the first wire 2 and the second wire 3 easily electrically couples the first wire 2 and the second wire 3 to each other to cause a short circuit.

Therefore, in an implementation, the first barrier layer 101 is disposed at a position between the second wire 3 and the base substrate 10 in the wiring region 1, so that the interconnection short circuit between the first wire 2 and the second wire 3 caused by the migration of the metal material can be effectively avoided.

The first wire 2 and the second wire 3 are located at different heights from the upper surface of the base substrate 10, i.e., on different planes, so that a migration path of the metal material is lengthened, and more energy is required for the metal material to migrate to another plane with a different height, thereby significantly reducing the possibility of the first wire 2 and the second wire 3 being electrically coupled due to the migration of the metal material.

In addition, the first barrier layer 101 is arranged between the second wire 3 and the base substrate 10, and can effectively prevent water vapor from invading the second wire 3 above the first barrier layer 101, so that the migration of the metal material caused by the water vapor can be effectively avoided.

Meanwhile, the first barrier layer 101 can also block the migration of the metal material in the first wire 2 and the second wire 3, i.e., the migrated metal material cannot pass through the first barrier layer 101.

In the embodiments of the present disclosure, the first barrier layer 101 being disposed between the second wire 3 and the base substrate 10 is taken as an example, and in other embodiments, the first barrier layer 101 may also be disposed between the first wire 2 and the base substrate 10, that is, the second wire 3 is disposed directly on the upper surface of the base substrate 10. The first barrier layer 101 also functions to make the first wire 2 and the second wire 3 on different planes, and block water vapor from invading the first wire 2 located above the first barrier layer 101 and migration of the metal material in the first wire 2 and the second wire 3.

In the present embodiment, the first wire 2 and the second wire 3 have a same structure and each includes a migratable metal layer including a migratable metal, and in an implementation, a distance from a surface of the first barrier layer 101 distal to the base substrate to the base substrate is greater than a distance from a surface of the migratable metal layer of the first wire 2, under which no first barrier layer 101 is provided, proximal to the base substrate to the base substrate. With such a structure, migration of the metal material between the first wire 2 and the second wire 3 can be effectively prevented.

In another implementation, a distance from a surface of the first barrier layer 101 distal to the base substrate to the base substrate is greater than or equal to a distance from a surface of the migratable metal layer of the first wire 2 distal to the base substrate to the base substrate. In some implementations, a distance of a surface of the first barrier layer 101 distal to the base substrate to the base substrate may also be less than or equal to a distance of a surface of the first wire 2 distal to the base substrate to the base substrate. With such a structure, the migration of the metal material between the first wire 2 and the second wire 3 can be more effectively prevented.

For example, when $Ag^+$ migrates from the first wire 2 to the second wire 3 under the action of an electric field between the first wire 2 and the second wire 3, due to the first barrier layer 101, the migratable metal layer in the first wire 2 and the migratable metal layer in the second wire 3 are located at different heights, and $Ag^+$ can only move along a direction of the electric field lines between the first wire 2 and the second wire 3, and more energy is required for migrating to planes at different heights, so that a reaction of the metal material after migration with the ionized $OH^-$ of the second wire 3 is greatly reduced, and the possibility of short circuit between the first wire 2 and the second wire 3 is remarkably reduced.

In the present embodiment, the display substrate further includes a bonding region 5, in the bonding region 5, a plurality of first bonding terminals 6 and a plurality of second bonding terminals 7 are disposed on an upper surface of the base substrate 10, the first bonding terminals 6 and the second bonding terminals 7 are adjacent to and spaced apart from each other, each of the first bonding terminals 6 and the second bonding terminals 7 contains metal material that can migrate under the action of an electric potential difference and water vapor, and the first bonding terminals 6 and the second bonding terminals 7 have an electric potential difference there between in an operation state.

The display substrate further includes a third barrier layer 103 disposed on a plane where the first bonding terminal 6 and the second bonding terminal 7 are located, i.e., on the upper surface of the base substrate 10, and located at a space between adjacent first bonding terminal 6 and second bonding terminal 7. The third barrier layer 103 is located between the adjacent first bonding terminal 6 and second bonding terminal 7, and can block water vapor from invading, and can block metal material in the first bonding terminal 6 and the second bonding terminal 7 from migrating.

In an implementation, the first bonding terminal 6 and the second bonding terminal 7 are disposed on a same plane, i.e., on the upper surface of the base substrate 10, which is advantageous for the bonding terminals to achieve a bonding connection. The third barrier layer 103 is disposed on the plane where the first bonding terminal 6 and the second bonding terminal 7 are located, i.e., the third barrier layer 103, the first bonding terminal 6 and the second bonding terminal 7 are all disposed on the upper surface of the base substrate 10, so that the arrangement of the third barrier layer 103 does not affect the normal bonding of the bonding terminals.

In the bonding region 5, the metal material that migrates under the action of the potential difference and the water vapor may be silver (Ag), copper (Cu), or the like. Since the metal material which can migrate easily migrates under the action of the potential difference and the water vapor to form a dispersed gel structure, and the dispersed gel structure is accumulated between the first bonding terminal 6 and the second bonding terminal 7, the first bonding terminal 6 and the second bonding terminal 7 are easily electrically coupled with each other, and a short circuit occurs.

Therefore, in an implementation, by disposing the third barrier layer 103 in a space between the first bonding terminal 6 and the second bonding terminal 7 in the bonding region 5, the invasion of water vapor can be blocked, so that the migration of the metal material can be effectively avoided. Meanwhile, the third barrier layer 103 can also block the metal materials in the first bonding terminal 6 and the second bonding terminal 7 from migrating, that is, the migrated metal material cannot pass through the third barrier layer 103 and thus cannot migrate from one bonding terminal to the other bonding terminal, so that the interconnection short circuit between the first bonding terminal 6 and the second bonding terminal 7 caused by the migration of the metal material can be effectively avoided.

In an implementation, the display substrate further includes a second barrier layer 102 and a fourth barrier layer 104. The second barrier layer 102 is disposed on an upper side of the second wire 3, i.e., on a side of the second wire 3 distal to the base substrate 10.

The fourth barrier layer 104 is disposed on an upper side of the third barrier layer 103, i.e., on a side of the third barrier layer 103 distal to the base substrate 10. The third barrier layer 103 and the fourth barrier layer 104 are stacked on the side of the base substrate 10 between the first bonding terminal 6 and the second bonding terminal 7.

In the present embodiment, the first bonding terminal 6 and the second bonding terminal 7 may have a same structure and each includes a migratable metal layer, and a distance from a surface of the third barrier layer 103 distal to the base substrate to the base substrate is greater than or equal to a distance from a surface of the migratable metal layer of any one of the first bonding terminal 6 and the second bonding terminal 7 distal to the base substrate to the base substrate. In some implementations, a distance from the surface of the third barrier layer 103 distal to the base substrate to the base substrate may also be less than or equal to a distance from a surface of any one of the first bonding terminal 6 and the second bonding terminal 7 distal to the base substrate to the base substrate.

For example, when $Ag^+$ migrates from the first bonding terminal 6 to the second bonding terminal 7 under the action of an electric field between the first bonding terminal 6 and the second bonding terminal 7, since the first bonding terminal 6 and second bonding terminal 7 are spaced apart by the third barrier layer 103, $Ag^+$ cannot pass through the third barrier layer 103 to react with ionized $OH^-$ of the second wire 3, significantly reducing the possibility of short circuit between the first bonding terminal 6 and the second bonding terminal 7.

It should be noted that, the first wire 2 is disposed on the base substrate 10, an upper side of the first wire 2 is a side of the first wire 2 distal to the base substrate 10, and an lower side of the first wire 2 is a side of the first wire 2 proximal to the base substrate 10. Accordingly, the second wire 3 is disposed on the base substrate 10, an upper side of the second wire 3 is a side of the second wire 3 distal to the base substrate 10, and a lower side of the second wire 3 is a side of the second wire 3 proximal to the base substrate 10.

In an implementation, a width of the first wire 2 is smaller than a width of the second wire 3. As shown in FIG. 1, the first barrier layer 101 is disposed on a side of the second wire 3 proximal to the base substrate, and the first barrier layer 101 and the first wire 2 are located on a same plane, i.e., the first barrier layer 101 and the first wire 2 are both disposed on the upper surface of the base substrate, so that the first barrier layer 101 can raise the second wire 3, i.e., the second wire 3 is located on a plane higher than a plane where the first wire 2 is located, thereby realizing that the first wire 2 and the second wire 3 are located on different planes.

In addition, the second barrier layer 102 of the display substrate is disposed on a side of the second wire 3 distal to the base substrate. The second barrier layer 102 can play a role of preventing water vapor from invading into the second wire 3.

It should be noted that, in consideration of the display substrate with narrow bezels, the widths of the first wires 2 and the second wires 3 in the wiring region 1 in the frame region are both relatively narrow, and the first barrier layer 101 is disposed at the position where the second wire 3 with a large width is located, so that difficulty of the manufacturing process of the first barrier layer 101 is reduced. Of course, if the manufacturing process can be realized, it is also possible to dispose the first barrier layer 101 between the first wire 2 and the base substrate 10.

In an implementation, the first wire 2 and the second wire 3 have a same structure and a same thickness, each of the first wire 2 and the second wire 3 includes a first sub-film layer 201, a second sub-film layer 202 and a third sub-film layer 203 stacked in sequence from bottom to top, and the second sub-film layer 202 is made of a material including a metal material that can migrate under the action of potential difference and water vapor.

A thickness of the first barrier layer 101 is greater than or equal to a sum of the thicknesses of the first sub-film layer 201 and the second sub-film layers 202, and less than an overall thickness of the first wire 2. With such arrangement, the first barrier layer 101 can play a role of raising second wire 3, blocking water vapor invasion and blocking metal material migration, and can also avoid to some extent that normal display of the substrate being used as a display substrate is affected by its thickness.

In one embodiment, the orthographic projection of the second wire 3 on the base substrate 10 coincides with the orthographic projection of the first barrier layer 101 on the base substrate 10. The orthographic projection of the second wire 3 on the base 10 coincides with the orthographic projection of the second barrier layer 102 of the display substrate on the base 10. By such arrangement, the first barrier layer 101 can better block the water vapor invasion, and can better block the metal materials in the first wire 2 and the second wire 3 from migrating.

In an implementation, the third barrier layer 103 is located on a same plane as the first bonding terminal 6 and the second bonding terminal 7, i.e., the third barrier layer 103 and the first and second bonding terminals 6 and 7 are all disposed on the upper surface of the base substrate 10.

The first bonding terminal 6 and the second bonding terminal 7 have a same structure and a same thickness, each of the first bonding terminal 6 and the second bonding terminal 7 includes a first sub-film layer 201, a second sub-film layer 202 and a third sub-film layer 203 which are sequentially stacked from bottom to top, and a material of the second sub-film layer 202 includes a metal material which can migrate under the action of potential difference and water vapor.

In an implementation, a thickness of the third barrier layer 103 is greater than or equal to a sum of thicknesses of the first sub-film layer 201 and the second sub-film layer 202 and less than a thickness of any one of the first bonding terminal 6 and the second bonding terminal 7. In this way, the third barrier layer 103 can play a role of blocking water vapor invasion, and blocking the migration of the metal material, furthermore, the arrangement of the third barrier layer 103 can not influence normal bonding of the bonding terminals.

In an implementation, the first barrier layer 101 is made of silicon dioxide or silicon nitride material, thus the first barrier layer 101 of this material can not only insulate, but also block water vapor from invading and block metal materials which are easy to migrate from migrating.

However, it should be noted that a color of the first barrier layer 101 made of silicon dioxide may be easily developed if a thickness of the first barrier layer 101 is large, which may affect normal display of the display substrate, but since the first barrier layer 101 is generally completely covered by the second wire 3, and the second wire 3 is made of opaque metal materials, in this case, the color development of the first barrier layer 101 may not affect the display.

It should be noted that, if the second wire 3 does not completely cover the first barrier layer 101, the first barrier layer 101 may be made of a colorless silicon nitride material in order to prevent the first barrier layer 101 from having a large thickness, which causes to develop a color and affect display. The second barrier layer 102 may be made of an indium tin oxide material, thus the second barrier layer 102 of this material can well block water vapor intrusion due to compactness of the material, and on the other hand, a film layer made of the indium tin oxide needs to be formed in other areas (such as a display area) of the display substrate, therefore, no additional manufacturing process of the display substrate is added.

Certainly, other materials having the above functions may be used for the first barrier layer 101 and the second barrier layer 102.

The third barrier layer 103 may be formed of a same material and by a same process as the first barrier layer 101, and the fourth barrier layer 104 may be formed of a same material and by a same process as the second barrier layer 102, which will not be described in detail herein.

One arrangement of the first wire 2 and the second wire 3 is shown on the left side of FIG. 1, but this is not limiting. In other implementations, the second wire 3 may be disposed between two adjacent first wires 2. In other implementations, the first wires 2 and the second wires 3 may also be adjacent and alternately arranged or arranged in other ways. The first wire 2 is kept at a high potential in the operation state and the second wire 3 is kept at a low potential in the operation state.

In an implementation, there are a plurality of first bonding terminals 6 and a plurality of second bonding terminals 7. The plurality of first bonding terminals 6 and the plurality of second bonding terminals 7 are alternately distributed. The first bonding terminals 6 are kept at a high potential in the operation state and the second bonding terminals 7 are kept at a low potential in the operation state, i.e., the first bonding terminals 6 are coupled to a supply voltage terminal with high potential and the second bonding terminals 7 are coupled to a supply voltage terminal with low potential.

In an implementation, the first bonding terminals 6 are coupled to the first wires 2 in a one-to-one correspondence, the second bonding terminals 7 are coupled to the second wires 3 in a one-to-one correspondence. That is, the first wires 2 are coupled to the power voltage terminal with high potential through the first bonding terminals 6 respectively, and the second wires 3 are coupled to the power voltage terminal with low potential through the second bonding terminals 7 respectively.

For example, the first sub-film layer 201 and the third sub-film layer 203 of each of the first wire 2, the second wire 3, the first bonding terminal 6, and the second bonding terminal 7 are made of indium tin oxide, and the second sub-film layer 202 of each of the first wire 2, the second wire 3, the first bonding terminal 6, and the second bonding terminal 7 is made of a metal material that is easy to migrate, such as silver. The wires and the bonding terminals thus constructed have good ductility and electrical conductivity.

It should be noted that, in the wiring region, the third barrier layer and the fourth barrier layer may be provided between adjacent first wire 2 and second wire 3, or, of course, the first barrier layer may be provided below one of the first wire 2 and the second wire 3, and the third barrier layer and the fourth barrier layer may be provided between the first wire 2 and the second wire 3, to prevent silver migration. The technical principle and the technical effect are similar to the above, and the detailed description is omitted here. Similarly, in the bonding region, the first blocking layer may be disposed below one of the first bonding terminal 6 and the second bonding terminal 7, that is, a blocking structure identical to that of the first wire and the second wire may be disposed, or the first blocking layer may be disposed below one of the first bonding terminal 6 and the second bonding terminal 7, and the third blocking layer may also be disposed between the first bonding terminal 6 and the second bonding terminal 7, and the structure thereof may be referred to the foregoing embodiments, which will not be described herein again.

In an implementation, in a touch area of the display substrate, the first wire 2 is a touch driving line or a touch sensing line, and the second wire 3 is a ground line. Due to the narrow bezel requirements of the display substrate at present, a distance between the adjacent first wires 2 is short, and signal interference is easy to occur between the adjacent first wires 2 in the operation state, so the grounded second wire 3 is arranged between the adjacent first wires 2 to block the signal interference between the two adjacent first wires 2.

Figure 2:
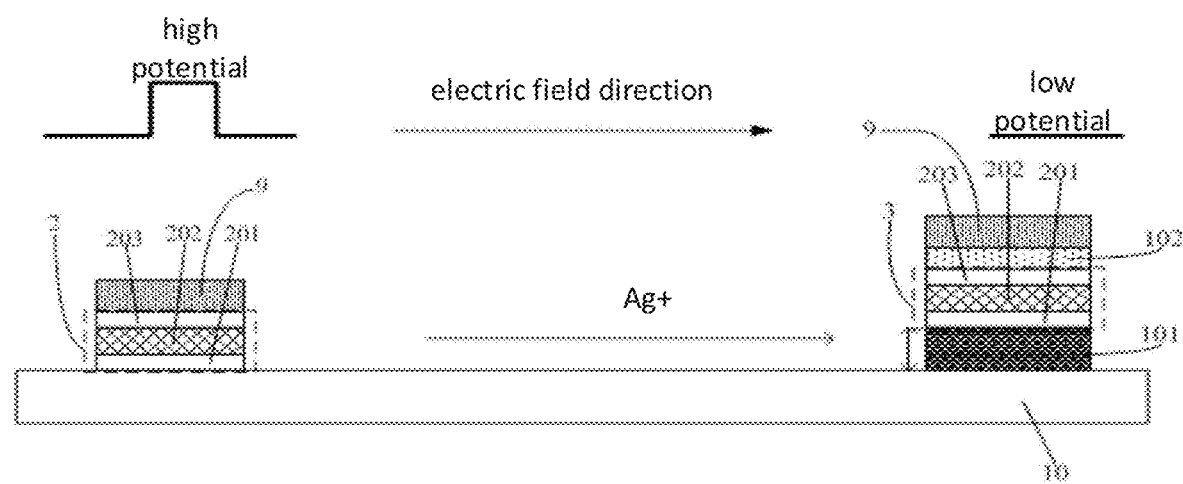
FIG. 2 is a schematic diagram of a first barrier layer blocking migration of a metal material according to an embodiment of the present disclosure.

As shown in FIG. 2, in the operation state, the first wire 2 receives a high voltage from the power supply voltage terminal with high potential through the first bonding terminal 6, and the first wire 2 receives a low voltage from the power supply voltage terminal with low potential through the second bonding terminal 7, so that the potential of the first wire 2 is higher than that of the second wire 3. When a metal material (such as silver) which is easy to migrate migrates, $Ag^+$ migrates more easily from the high potential side to the low potential side under the action of a potential difference and an electric field, and a first blocking layer 101 is provided at a position where the grounded second wire 3 with a lower potential is located, so that $Ag^+$ can be blocked from migrating from the first wire 2 with the high potential to the second wire 3 with the low potential more effectively.

It should be noted that, in the display area of the display substrate, the first wire 2 is a gate line or a data line, and the second wire 3 is a ground line.

In an implementation, as shown in FIG. 1, the display substrate may further include a protective layer 9, and the protective layer 9 is distributed on the wiring region 1 and the bonding region 5. In the wiring region 1, the protective layer 9 is correspondingly disposed above the first wires 2 and the second barrier layer 102, for example, the protective layer 9 covers upper surfaces of the first wires 2 and an upper surface of the second barrier layer 102, and an orthographic projection of the protective layer 9 on the base substrate 10 covers orthographic projections of the first wires 2 and the second barrier layer 102 on the base substrate 10. With thus configuration, the first wires 2, the second wire 3, and the second barrier layer 102 can be well protected.

In the bonding region 5, the protective layer 9 is correspondingly disposed above the first bonding terminals 6, the second bonding terminals 7 and the third barrier layers 103, for example, the protective layer 9 covers upper surfaces of the first bonding terminals 6, upper surface of the second bonding terminals 7 and upper surfaces of the fourth barrier layers 104, an orthographic projection of the protective layer 9 on the base substrate 10 completely covers orthographic projections of the fourth barrier layers 104 on the base substrate 10, and partially covers orthographic projections of the first bonding terminals 6 and the second bonding terminals 7 on the base substrate 10, that is, the protective layer 9 above the first bonding terminals 6 and the second bonding terminals 7 includes an opening area exposing a portion of the first bonding terminals 6 and the second bonding terminals 7. With such arrangement, the fourth barrier layers 104, the first bonding terminals 6 and the second bonding terminals 7 can be well protected, and the metal material easy to migrate is prevented from migrating due to the overlarge contact area between surfaces of the first bonding terminals 6 and the second bonding terminals 7 and water vapor while the first bonding terminals 6 and the second bonding terminals 7 are normally bound and coupled.

The protective layer 9 is made of transparent optical adhesive material. The protective layer 9 of this material can also effectively block the invasion of water vapor.

In an implementation of the present disclosure, the first wire 2, the first barrier layer 101, the first bonding terminal 6, the second bonding terminal 7, the third barrier layer 103 and the protective layer 9 are disposed on the upper surface of the base substrate 10. For example, the base substrate 10 is configured as a glass substrate and a film layer structure disposed thereon, and is not limited thereto.

An embodiment of the disclosure further provides a display substrate, which is different from the embodiment shown in FIG. 1 to 2 in that the display substrate does not include the second barrier layer. The display substrate includes a first barrier layer, the first barrier layer is disposed on a side of the first wire or the second wire proximal to the base substrate, for example, the first barrier layer is disposed on a side of the second wire proximal to the base substrate, and the first barrier layer and the first wire are located on the same plane, i.e., on the upper surface of the base substrate.

In the present embodiment, since the display substrate does not include the second barrier layer, if the first barrier layer is made of silicon dioxide, a color of the first barrier layer can be developed due to a large thickness of the first barrier layer, in order to avoid the color development caused by the thick thickness of the first barrier layer from affecting a normal display of the display substrate, the first barrier layer may be made of silicon nitride.

In the present embodiment, since the first barrier layer is usually disposed in a frame area which is a non-display area, the color development of the first barrier layer does not affect the display, and if the first barrier layer is disposed in the display area, the first barrier layer may be made of the silicon nitride material.

According to the present embodiment, only the first barrier layer is provided to avoid short circuit between the first wire and the second wire caused by migration of the metal material, and the process is simplified.

Other structures of the display substrate in the present embodiment may refer to the embodiments shown in FIG. 1 and FIG. 2, and the specific structures and technical effects thereof are similar, and are not described herein again.

According to the display substrate disclosed by the present embodiment, the first barrier layer is arranged at the position of the second wire in the wiring region, so that the first wire and the second wire are positioned on different planes, the migration path of the metal material is lengthened, and more energy is required when the metal material is migrated to the planes with different heights, so that the possibility of electrical coupling of the first wire and the second wire due to migration of the metal material is greatly reduced. The first barrier layer can block water vapor invasion, so that the necessary condition of metal material migration can be damaged to a certain extent. Meanwhile, the first barrier layer can also block metal materials in the first wire and the second wire from migrating, namely the metal materials which migrate cannot pass through the first barrier layer, so that interconnection short circuit between the first wire and the second wire caused by migration of the metal materials is avoided, and the quality of the display substrate is improved.

Figure 3:
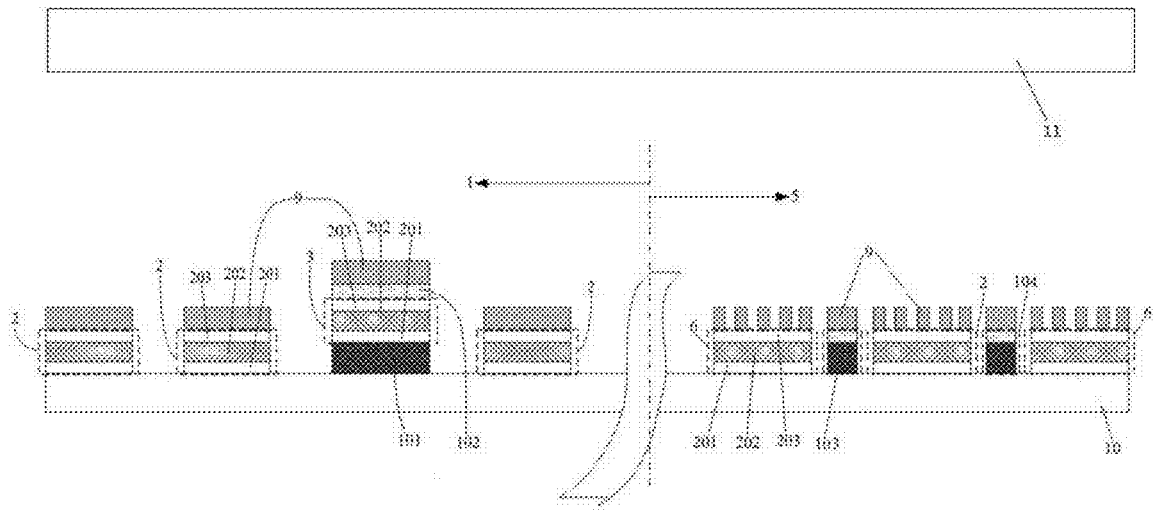
FIG. 3 is a schematic structural diagram of a display device according to an embodiment of the present disclosure.

The present disclosure further provides a display device. FIG. 3 is a schematic structural diagram of a display device according to an embodiment of the present disclosure, and as shown in FIG. 3, the display device may include the display substrate according to the embodiments shown in FIGS. 1 and 2, and the display device may further include an opposite substrate 11 opposite to the display substrate.

By adopting above-mentioned display substrate, metal material that is easily to migrate under the action of a potential difference and water vapor is effectively prevented from migrating between first wire and second wire, and then a short circuit between the first wire and the second wire is effectively prevented, and display quality of the display device is promoted.

The display device provided by the present disclosure may be any product or component having a display function, such as an LCD panel, an LCD television, an OLED panel, an OLED television, a display, a mobile phone, a navigator, or a semi-finished product of the above product or component having the display function.

Figure 4:
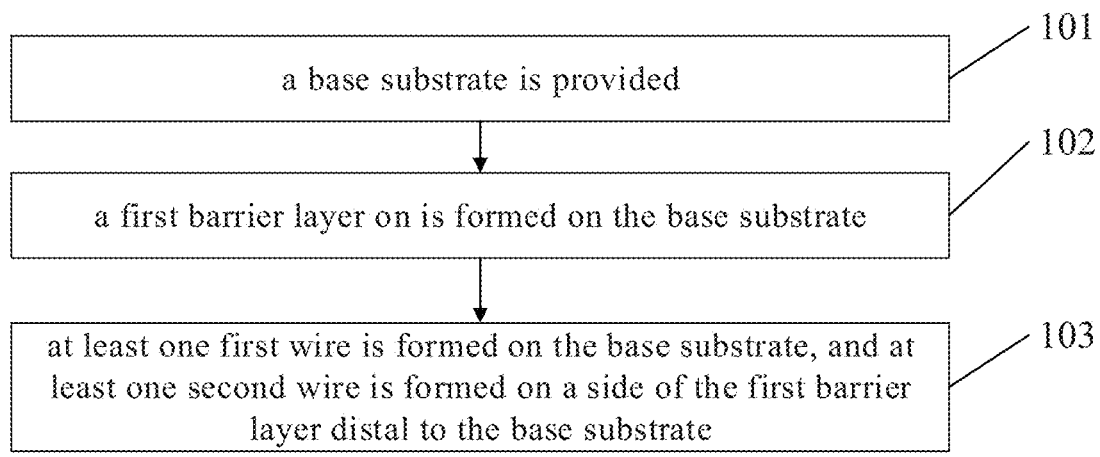
FIG. 4 is a schematic flow chart of a method for manufacturing a display substrate according to an embodiment of the present disclosure.

An embodiment of the present disclosure further provides a method for manufacturing the display substrate, and FIG. 4 is a schematic flow chart of a method for manufacturing a display substrate according to an embodiment of the present disclosure, and as shown in FIG. 4, the method may include the following steps 101 to 103.

At step 101, a base substrate is provided.

At step 102, a first barrier layer on is formed on the base substrate.

At step 103, at least one first wire is formed on the base substrate, and at least one second wire is formed on a side of the first barrier layer distal to the base substrate, that is, the second wire is formed on the first barrier layer, so that a distance from a surface of the first wire distal to the base substrate to the base substrate is different from a distance from a surface of the second wire distal to the base substrate to the base substrate.

In an implementation, a plurality of first wires and a plurality of second wires are formed. The first wires and the second wires are alternatively arranged and spaced apart from each other, and contain metal materials which can migrate under the action of potential difference and water vapor, and the first wire and the second wire have potential difference therebetween in an operation state.

According to the method for manufacturing the display substrate in the present disclosure, the first barrier layer is formed, and the second wire is formed on the first barrier layer, so that the heights of the first wire and the second wire on the base substrate are different, and therefore metal materials which are easy to migrate under the action of potential difference and water vapor are effectively prevented from migrating between the first wire and the second wire, and short circuit between the first wire and the second wire is effectively prevented.

Figure 5:
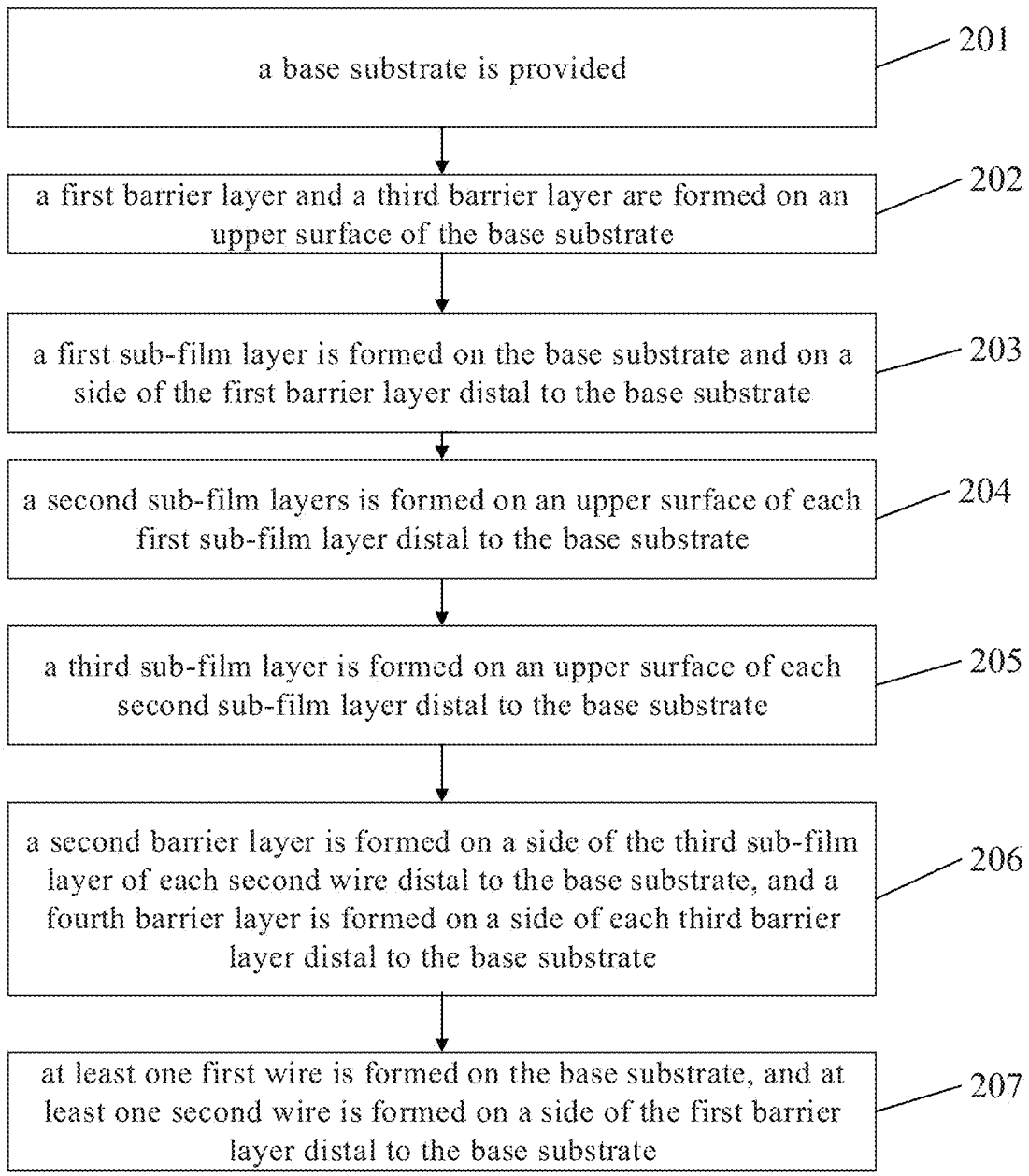
FIG. 5 is another schematic flow chart of a method for manufacturing a display substrate according to an embodiment of the present disclosure.

An embodiment of the present disclosure further provides a method for manufacturing the display substrate, FIG. 5 is another schematic flow chart of a method for manufacturing a display substrate according to another embodiment of the disclosure, and as shown in FIG. 5, the method may include the following steps 201 to 207.

At step 201, a base substrate is formed;

At step 202, a first barrier layer and a third barrier layer are formed on an upper surface of the base substrate.

In this step, the first barrier layer and the third barrier layer are formed on the upper surface of the base substrate by a single patterning process (e.g., a plating, exposure, and development and etching process), for example, the first barrier layer is formed in the wiring region, and in the bonding region, the third barrier layer is formed.

At step 203, a first sub-film layer is formed on the base substrate and on a side of the first barrier layer distal to the base substrate.

The first sub-film layer is formed through a single patterning process (e.g., exposure, development and etching processes), for example, the first sub-film layers of the first wire and the second wire are formed on the substrate and on the first barrier layer in the wiring region, and the first sub-film layer of the second wire is formed on the first barrier layer. In the bonding region, first sub-film layers of a first bonding terminal and a second bonding terminal are formed on the base substrate, and the first barrier layer is disposed between the first bonding terminal and the second bonding terminal.

At step 204, a second sub-film layers is formed on an upper surface of each first sub-film layer distal to the base substrate.

A second sub-film layer is formed on the upper surface of each first sub-film layer through a single patterning process (such as coating, exposing, developing and etching processes), for example, in the wiring region, the second sub-film layers of the first wire and the second wire are formed on the upper surface of each first sub-film layer, where the second sub-film layer of the first wire and the second sub-film layer of the second wire include metal materials which can migrate under the action of potential difference and water vapor.

In the bonding region, a second sub-film layer of each of the first bonding terminal and the second bonding terminal is formed on the upper surface of each first sub-film layer, the second sub-film layer of the first bonding terminal and the second sub-film layer of the second bonding terminal include metal materials which can migrate under the action of potential difference and water vapor.

At step 205, a third sub-film layer is formed on an upper surface of each second sub-film layer distal to the base substrate.

The third sub-film layer is formed on the upper surface of each second sub-film layer by a single patterning process (e.g., exposure, development and etching processes), for example, in the wiring region, the third sub-film layer of each of the first wire and the second wire is formed on each second sub-film layer, and in the bonding region, the third sub-film layer of each of the first bonding terminal and the second bonding terminal is formed on each second sub-film layer.

At step 206, a second barrier layer is formed on a side of the third sub-film layer of each second wire distal to the base substrate, and a fourth barrier layer is formed on a side of each third barrier layer distal to the base substrate.

The second barrier layer is formed on the upper surface of each third sub-film layer and the fourth barrier layer is formed on the third barrier layer by a single patterning process (such as exposure, development and etching processes), for example, in the wiring region, the second barrier layer is formed on each third sub-film layer corresponding to the first barrier layer, so that the first barrier layer is arranged on a side of the second wire proximal to the base substrate and the second barrier layer is arranged on a side of the second wire distal to the base substrate. In the bonding region, the fourth barrier layer is formed on each third barrier layer.

For example, the second barrier layer may be formed using the same mask plate as that used to form the first barrier layer.

At step 207, a protective layer is formed on a side of the third sub-film layer, the second barrier layer and the fourth barrier layer distal to the base substrate.

The protective layer is formed by a single patterning process (such as exposure, development and etching processes), for example, in the wiring region, the protective layer is formed above the first wires, the second wires and the second barrier layers, an orthographic projection of the protective layer on the base substrate covers orthographic projections of the first wires, the second wires and the second barrier layers on the base substrate.

In the bonding region, the protective layer is formed above the first bonding terminals, the second bonding terminals and the fourth barrier layers, an orthographic projection of the protective layer on the base substrate completely covers orthographic projections of the fourth barrier layers on the base substrate, and partially covers orthographic projections of the first bonding terminals and the second bonding terminals on the base substrate.

It should be noted that, although the above embodiments have been described by taking the example in which the first barrier layer and the second barrier layer are formed in the wiring region, and the third barrier layer and the fourth barrier layer are formed in the bonding region, the present invention is not limited thereto, and for example, the third barrier layer and the fourth barrier layer may also be formed in the wiring region, and the first barrier layer and the second barrier layer may also be formed in the bonding region, and the specific structure may refer to above description.

The method for manufacturing the display substrate according to the embodiment of the present disclosure may be the method for manufacturing the display substrate according to the embodiments shown in FIGS. 1 to 2, and in other embodiments of the present disclosure, the display substrate according to the embodiment shown in FIGS. 1 to 2 may be formed by other processes. Specific features and technical effects of each structure can be referred to the above embodiments, and are not described in detail herein.

According to the method for manufacturing the display substrate, the first barrier layer and the second barrier layer are formed, and the first barrier layer is formed between the first wire or the second wire and the base substrate in the wiring region, and the third barrier layer is formed between the first bonding terminal and the second bonding terminal in the bonding region, so that metal materials which are easy to migrate under the action of potential difference and water vapor are effectively prevented from migrating between the first wire and the second wire, and between the first bonding terminal and the second bonding terminal; and short circuit is effectively prevented from occurring between the first wire and the second wire, and between the first bonding terminal and the second bonding terminal.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A display substrate, comprising:
a base substrate;
first wires on a surface of the base substrate;
a first barrier layer on the surface of the base substrate;
a second wire;
on a surface of the first barrier layer away from the base substrate and located between two adjacent first wires, and the first wires and the second wire are spaced apart from each other, and
a second barrier layer, which is located on a side of the second wire away from the base substrate, wherein
the first wires and the second wire have a same structure, and each comprises a migratable metal layer comprising a migratable metal, and wherein a distance from a surface of the first barrier layer away from the base substrate to the base substrate is greater than a distance from a surface of the migratable metal layer of the first wire proximal to the base substrate to the base substrate,
an orthographic projection of the second wire on the base substrate coincides with an orthographic projection of the first barrier layer on the base substrate,
the orthographic projection of the second wire on the base substrate coincides with an orthographic projection of the second barrier layer on the base substrate, and
the first barrier layer is made of silicon dioxide or silicon nitride, and the second barrier layer is made of indium tin oxide.

2. The display substrate of claim 1, wherein a distance from the surface of the first barrier layer away from the base substrate to the base substrate is greater or equal to a distance from a surface of the migratable metal layer of the first wire away from the base substrate to the base substrate.

3. The display substrate of claim 1, further comprising:
a third wire on the side of the base substrate;
a fourth wire on the side of the base substrate; and
a third barrier layer on the side of the base substrate, the third barrier layer being located between the third wire and the fourth wire and spaced apart from the third wire and the fourth wire.

4. The display substrate of claim 3, wherein the third wire and the fourth wire each comprises a migratable metal layer comprising a migratable metal, and wherein a distance from a surface of the third barrier layer away from the base substrate to the base substrate is greater than or equal to a distance from a surface of the migratable metal layer of one of the third wire and the fourth wire away from the base substrate to the base substrate.

5. The display substrate of claim 4, further comprising: a fourth barrier layer located on a side of the third barrier layer away from the base substrate.

6. The display substrate of claim 5, wherein the third barrier layer is made of silicon dioxide or silicon nitride, and the fourth barrier layer is made of indium tin oxide.

7. The display substrate of claim 3, wherein the third wire is a first bonding terminal, the fourth wire is a second bonding terminal, the first bonding terminal is coupled with a corresponding first wire, and the second bonding terminal is coupled with a corresponding second wire.

8. The display substrate of claim 1, wherein the first wire is any one of a touch driving line, a touch sensing line, a gate line, and a data line, and the second wire is a ground line.

9. A display device, comprising the display substrate of claim 1, and an opposite substrate opposite to the display substrate.

10. A method for manufacturing a display substrate, comprising:
providing a base substrate;
forming a first barrier layer on a surface of the base substrate; forming first wires on the surface of the base substrate, and forming a second wire on a surface of the first barrier layer away from the base substrate, the second wire is arranged between two adjacent first wires, and the first wires and the second wire are spaced apart from each other, and
forming a second barrier layer on a side of the second wire away from the base substrate, wherein
the first wires and the second wire have the same structure, and each comprises a migratable metal layer comprising a migratable metal, and wherein a distance from a surface of the first barrier layer away from the base substrate to the base substrate is greater than a distance from a surface of the migratable metal layer of the first wire proximal to the base substrate to the base substrate,
an orthographic projection of the second wire on the base substrate coincides with an orthographic projection of the first barrier layer on the base substrate,
the orthographic projection of the second wire on the base substrate coincides with an orthographic projection of the second barrier layer on the base substrate, and
the first barrier layer is made of silicon dioxide or silicon nitride, and the second barrier layer is made of indium tin oxide.

11. The method of claim 10, wherein the first wires and the second wire are formed to have a same structure, and each comprises a migratable metal layer, and wherein a distance from a surface of the first barrier layer away from the base substrate to the base substrate is greater than or equal to a distance from a surface of the migratable metal layer of the first wire away from the base substrate to the base substrate.

12. The method of claim 10, further comprising:
forming a third wire and a fourth wire, which are adjacent to and spaced apart from each other, on the side of the base substrate;
forming a third barrier layer on the side of the base substrate and between the third wire and the fourth wire.

13. The method of claim 12, wherein each of the third wire and the fourth wire comprises a migratable metal layer, and wherein a distance from a surface of the third barrier layer away from the base substrate to the base substrate is greater than or equal to a distance from a surface of the migratable metal layer of one of the third wire and the fourth wire away from the base substrate to the base substrate.

14. The method of claim 13, further comprising:
forming a fourth barrier layer on a side of the third barrier layer away from the base substrate.

15. The method of claim 13, wherein the third wire is a first bonding terminal, and the fourth wire is a second bonding terminal.

* * * * *